(12) United States Patent
Bae et al.

(10) Patent No.: US 10,355,169 B2
(45) Date of Patent: Jul. 16, 2019

(54) SUBSTRATE STRUCTURE, METHOD FOR FORMING SAME, AND METHOD FOR MANUFACTURING NITRIDE SEMICONDUCTOR USING SAME

(71) Applicant: Hexasolution Co., Ltd., Yeongtong-gu, Suwon-si, Gyeonggi-do (KR)

(72) Inventors: Duk-Kyu Bae, Gyeonggi-do (KR); Young-Boo Moon, Gyeonggi-do (KR); Yongjo Park, Gyeonggi-do (KR)

(73) Assignee: Hexasolution Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/326,256

(22) PCT Filed: Jun. 19, 2015

(86) PCT No.: PCT/KR2015/006263
§ 371 (c)(1),
(2) Date: Jan. 13, 2017

(87) PCT Pub. No.: WO2016/010270
PCT Pub. Date: Jan. 21, 2016

(65) Prior Publication Data
US 2017/0213938 A1 Jul. 27, 2017

(30) Foreign Application Priority Data
Jul. 14, 2014 (KR) ........................ 10-2014-0088372

(51) Int. Cl.
*H01L 33/32* (2010.01)
*H01L 33/22* (2010.01)
(Continued)

(52) U.S. Cl.
CPC .......... *H01L 33/32* (2013.01); *H01L 21/0242* (2013.01); *H01L 21/0254* (2013.01);
(Continued)

(58) Field of Classification Search
USPC ........................................................ 257/76
See application file for complete search history.

(56) References Cited

U.S. PATENT DOCUMENTS

| | | |
|---|---|---|
| 8,791,468 B2 | 7/2014 | Lee et al. |
| 2004/0038513 A1 | 2/2004 | Kohl et al. |

(Continued)

FOREIGN PATENT DOCUMENTS

| | | |
|---|---|---|
| JP | 2002118294 | 4/2002 |
| JP | 2002200599 | 7/2002 |

(Continued)

OTHER PUBLICATIONS

Sep. 11, 2015 International Search Report for PCT/KR2015/006263.

*Primary Examiner* — Zandra V Smith
*Assistant Examiner* — Lawrence C Tynes, Jr.
(74) *Attorney, Agent, or Firm* — Hahn Loeser & Parks LLP (57) ABSTRACT

Disclosed is a substrate structure and a method for forming the same, in which a high-quality nitride semiconductor layer may be formed with a reduced stress applied to the nitride semiconductor layer at the growth of the nitride semiconductor layer and also be easily separated from the substrate, and a semiconductor lamination structure using the same and a method for forming the same, and a method for manufacturing a nitride semiconductor using the same. The substrate structure includes a single-crystal substrate heterogeneous from a nitride semiconductor, and a crystallized inorganic thin film having a leg portion configured to contact the substrate to define an integrated cavity between the leg portion and the substrate and an upper surface
(Continued)

extending from the leg portion and parallel to the substrate, the crystallized inorganic thin film having the same crystal structure as the substrate.

10 Claims, 6 Drawing Sheets

(51) Int. Cl.
*H01L 33/00* (2010.01)
*H01L 21/02* (2006.01)

(52) U.S. Cl.
CPC .... *H01L 21/0265* (2013.01); *H01L 21/02381* (2013.01); *H01L 21/02458* (2013.01); *H01L 21/02488* (2013.01); *H01L 21/02639* (2013.01); *H01L 33/0066* (2013.01); *H01L 33/0075* (2013.01); *H01L 33/22* (2013.01); *H01L 33/0079* (2013.01)

(56) References Cited

U.S. PATENT DOCUMENTS

| | | | |
|---|---|---|---|
| 2004/0206299 A1 | 10/2004 | Tadatomo et al. | |
| 2014/0070372 A1* | 3/2014 | Yoon | H01L 21/0254 257/615 |
| 2014/0159065 A1 | 6/2014 | Hu et al. | |
| 2017/0213938 A1* | 7/2017 | Bae | H01L 33/32 |

FOREIGN PATENT DOCUMENTS

| | | | | |
|---|---|---|---|---|
| JP | 2002-261032 | | 9/2002 | |
| KR | 10-2007-0042214 | | 4/2007 | |
| KR | 10-2012-0129439 | * | 10/2012 | ............. H01L 21/20 |

\* cited by examiner

SUBSTRATE STRUCTURE, METHOD FOR FORMING SAME, AND METHOD FOR MANUFACTURING NITRIDE SEMICONDUCTOR USING SAME

The present application is a 35 U.S.C. § 371(c) submission international application no. PCT/KR2015/006263, filed on 19 Jun. 2015 and published on 21 Jan. 2016 with publication no. WO 2016/010270 A1, which claims priority to Korean Patent Application No. 10-2014-0088372 filed in the Republic of Korea on 14 Jul. 2014, the disclosure of which is incorporated herein by reference.

TECHNICAL FIELD

The present disclosure relates to a semiconductor layer made of gallium nitride (GaN) or a mixed nitride of gallium and another metal, and a method for forming the same. The present disclosure also relates to an electronic or optoelectronic device including such a layer, a nitride semiconductor substrate, and a method for manufacturing the same. The technical field of the present disclosure may be broadly defined as a substrate structure for forming a high-quality nitride semiconductor layer with a small crystal defect and a method for forming the same.

BACKGROUND ART

A nitride semiconductor device made of gallium nitride or the like representatively includes an LED. The LED market has been increased based on low-output LED used for a keypad of small home appliances or portable communication devices such as cellular phones, or a back light unit of a liquid crystal display (LCD). Recently, as the necessity on a high-output high-efficient light source used for interior lightings, exterior lightings, vehicle interior or exterior lightings and a back light unit of a large LCD is increasing, the LED is also being shifted to high-output products.

In devices using a nitride semiconductor, "heterogeneous" substrates such as a sapphire substrate, a silicon carbide (SiC) substrate and a silicon substrate are most frequently used for the growth of the nitride semiconductor layer. However, since these heterogeneous substrate materials have mismatched lattice constants and different thermal expansion coefficients in comparison to nitrides, the nitride semiconductor layer growing on the heterogeneous substrate contains a lot of crystal defects such as dislocations. Such defects become a main factor of deteriorating the LED performance.

The sapphire substrate has a greater thermal expansion coefficient than the nitride semiconductor layer, and thus, if the nitride semiconductor layer grows at high temperature and is then cooled, a compression stress is applied to the nitride semiconductor layer. The silicon substrate has a smaller thermal expansion coefficient than the nitride semiconductor layer, and thus if the nitride semiconductor layer grows at high temperature and is then cooled, a tensile stress is applied to the nitride semiconductor layer. For this reason, the substrate is bent, and in order to prevent the substrate from being bent, the substrate should have a great thickness. Using a thick substrate just reduces a superficial phenomenon but does not reduce the stress of the thin film. If the stress of the thin film may be reduced, a thin substrate may be used advantageously. In addition, in order to separate a chip after an LED is fabricated, the substrate should be ground with a margin of about 100 μm. In this configuration, if a thin substrate may be used, there would be a great profit in aspect of LED production.

If necessary, the nitride semiconductor layer growing on the heterogeneous substrate should be separated from the heterogeneous substrate. For this, a laser lift-off has been proposed as an existing technique. However, even though the laser lift-off method is used, the substrate may be bent and the semiconductor layer may be damaged due to a difference in thermal expansion coefficient between the sapphire substrate and the nitride semiconductor. In addition, a defect such as a crack may be easily generated at an epitaxial layer due to an impact caused by a laser beam, and further the epitaxial layer is fragile, thereby resulting in an unstable process. The laser lift-off method is accompanied with thermal or mechanical deformation and decomposition of the nitride semiconductor. This causes a loss in a grown thin film and is also inefficient in aspect of energy.

In addition, the most serious problem of the LED is low light emission efficiency. Generally, the light emission efficiency is determined by light generation efficiency (internal quantum efficiency), light emission efficiency (external light extraction efficiency) out of a device, and light amplification efficiency by a phosphor. For increasing the output of the LED, it is important to improve characteristics of an active layer in view of the internal quantum efficiency, and it is also important to enhance external light extraction efficiency of the actually generated light.

A patterned sapphire substrate (PSS) prepared by forming a pattern on a sapphire substrate is known in the art as increasing the internal quantum efficiency by reducing defects generated at the growth of the nitride semiconductor layer and also increasing the external light extraction efficiency by reducing an internal total reflection.

Figure 1:
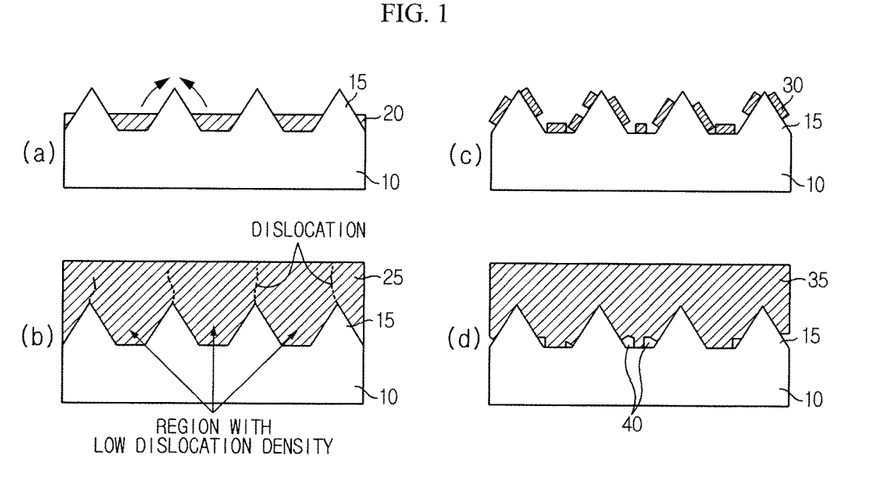
FIG. 1 is a diagram for illustrating a case where a nitride semiconductor layer grows using an existing PSS.

FIG. 1 is a diagram for illustrating a case where a nitride semiconductor layer grows using an existing PSS.

Referring to FIG. 1(a), in an existing PSS 10, a nitride semiconductor layer 20 starts growing on a bottom of a substrate and grows to cover an upper portion of a PSS lens 15 by means of epitaxial lateral overgrowth (ELO). Accordingly, as shown in FIG. 1(b), a final nitride semiconductor layer 25 having a low dislocation density between dislocated regions may be obtained.

If the nitride semiconductor layer is made of GaN, the GaN grows at 1100° C. or below. At this temperature, GaN generally grows just on the bottom due to a growth mode with a strong anisotropic property as shown in FIG. 1(a), and thus the dislocation density decreases in an area where ELO occurs as shown in FIG. 1(b), thereby improving the crystal quality.

However, if the nitride semiconductor layer is made of AlN, the above effects are not obtained. AlN grows at 1300° C. or above, higher than that of GaN. At this temperature, a growth mode with a strong isotropic property is applied. Accordingly, referring to FIG. 1(c), an AlN 30 actively grows not only on the bottom of the PSS 10 but also on a surface of the lens 15. Accordingly, the AlN epitaxial layer is highly likely to be merged before the bottom is entirely filled, and thus a void 40 is generated in the MN epitaxial layer 35 as shown in FIG. 1(d). The void 40 deteriorates the crystal quality.

Due to the above problems, it is not easy to apply the PSS to grow the AlN epitaxial layer, and thus the crystal quality deteriorates. Moreover, since the growth temperature of AlN is higher than that of GaN by 100° C. or more, AlN more seriously suffers from a stress caused by the thermal expansion coefficient, bending of the substrate or the like.

Therefore, there is demanded a method for separating a substrate with high reliability, or a method capable of obtaining a nitride semiconductor such as a high-quality nitride semiconductor substrate, a nitride semiconductor device and a nitride semiconductor layer regardless of the kind of material.

DISCLOSURE

Technical Problem

The present disclosure is designed to solve the problems of the related art, and therefore the present disclosure is directed to providing a substrate structure and a method for forming the same, in which a high-quality nitride semiconductor layer may be formed with a reduced stress applied to the nitride semiconductor layer at the growth of the nitride semiconductor layer and also be easily separated from the substrate, and a semiconductor lamination structure using the same and a method for forming the same, and a method for manufacturing a nitride semiconductor using the same.

Technical Solution

In one aspect of the present disclosure, there is provided a substrate structure, comprising: a single-crystal substrate heterogeneous from a nitride semiconductor; and a crystallized inorganic thin film having a leg portion configured to contact the substrate to define an integrated cavity between the leg portion and the substrate and an upper surface extending from the leg portion and parallel to the substrate, the crystallized inorganic thin film having the same crystal structure as the substrate.

The leg portion may have a hollow pipe shape. In an embodiment, there may be provided a plurality of leg portions, and the upper surface may be continuously formed to extend from the plurality of leg portions. An area occupied by the cavity may be greater than an area occupied by the leg portions.

In another aspect of the present disclosure, there is provided a semiconductor lamination structure, which further comprises a nitride semiconductor layer formed on the inorganic thin film, in addition to the configuration of the substrate structure. The nitride semiconductor layer may be a film having two or more layers. Even though the substrate and the nitride semiconductor layer have different thermal expansion coefficients, since the integrated cavity may be compressed or elongated by means of the nitride semiconductor layer, the stress applied to the nitride semiconductor layer decreases.

In another aspect of the present disclosure, there is provided a method for forming a substrate structure, comprising: forming a hole-type sacrificial layer pattern on a single-crystal substrate which is heterogeneous from a nitride semiconductor; and forming an inorganic thin film on the sacrificial layer pattern. The sacrificial layer pattern is removed from the substrate on which the inorganic thin film is formed, so that an integrated cavity defined by the substrate and the inorganic thin film is formed. After that, the inorganic thin film is crystallized into the same crystal structure as the substrate.

The sacrificial layer pattern may be formed in various ways. After a photoresist coated on the substrate, the sacrificial layer may be formed by means of a photolithography method. In other case, after a nano-imprint resin is coated on the substrate, the sacrificial layer may be formed by means of a nano-imprint method.

The inorganic thin film may be formed within a temperature range in which the sacrificial layer pattern is not deformed. The inorganic thin film may be formed by means of ALD. In addition, the sacrificial layer pattern may be removed by means of thermal treatment under an oxygen environment or wet removal using an organic solvent. The cavity is a space where the sacrificial layer pattern is removed and thus absent.

In the method for forming a substrate lamination structure according to the present disclosure, a nitride semiconductor layer may be formed on the crystallized inorganic thin film by using the substrate structure of the present disclosure or after the substrate structure according to the above method is formed.

In an embodiment for manufacturing a high-quality nitride semiconductor layer or an device or substrate including the same, a nitride semiconductor such as a vertical-type or horizontal-type LED, an LED transferred or transported to any substrate, or a nitride semiconductor such as a free-standing nitride semiconductor substrate may be manufactured by separating the substrate and the nitride semiconductor layer from each other, in the resultant product of the semiconductor lamination structure manufacturing method according to the present disclosure, or the semiconductor lamination structure according to the present disclosure.

If the substrate structure, the method for manufacturing the same, the method for manufacturing a nitride semiconductor using the same according to the present disclosure are used, it is possible to produce an ultraviolet light detector, an elastic surface-wave (SAW) device, an LED, an LD, a microwave electronic device or the like, which may be expanded to modules, systems or the like using these devices. Moreover, it is possible to manufacture a free-standing nitride semiconductor substrate. Details of other embodiments are included in the detailed description and the drawings.

Advantageous Effects

According to the present disclosure, the substrate structure includes an inorganic thin film defining an integrated cavity, and the inorganic thin film may be included while minimizing a contact surface with the substrate. If a nitride semiconductor layer is formed on the substrate structure, due to the cavity, an entire stress of the nitride semiconductor layer decreases. Therefore, even though a stress is generated at the nitride semiconductor layer due to a difference in thermal expansion coefficient between the substrate and the nitride semiconductor layer, the local stress is relaxed, and thus the resultant bending of the substrate may be reduced. Accordingly, even in a large-sized substrate, it is possible to use a relatively thin substrate.

In the semiconductor lamination structure according to the present disclosure, the nitride semiconductor layer is formed on the crystallized inorganic thin film above an integrated cavity. The crystallized inorganic thin film may solve the stress together with the nitride semiconductor layer growing thereon, and thus in the present disclosure, the nitride semiconductor layer grows to have high quality with a small defect density. Therefore, a high-quality nitride semiconductor layer with a small defect density may be formed, and due to the decrease of nitride semiconductor crystal defect density, the internal quantum efficiency may be enhanced. Even the MN with a superior isotropic growth mode may be formed with high quality without any irregular void.

In particular, in a method for forming a substrate structure and a semiconductor lamination structure according to the present disclosure, a hole-type sacrificial layer pattern is formed using a controlled method such as photolithography or nano-imprint, so that an integrated cavity is not formed in an irregular or random way but formed in a controlled way, thereby ensuring good reproduction and excellent device uniformity.

As a result, a nitride semiconductor epitaxial layer with excellent properties may grow, thereby implementing an opto-electronic device with high efficiency and high reliability.

In particular, the substrate structure and the semiconductor lamination structure according to the present disclosure include an integrated cavity, and thus the substrate and the nitride semiconductor layer do not contact much but are physically separated from each other to some extent. Accordingly, while the nitride semiconductor layer grows and then is cooled, the nitride semiconductor layer and the substrate may be naturally separated from each other just with a small physical force or impact without applying a great energy such as laser thereto. Therefore, the nitride semiconductor layer may be easily separated from the substrate without a laser lift-off method, and thus it is possible to manufacture a vertical-type or horizontal-type LED, an LED transferred or transported to any substrate, or a free-standing nitride semiconductor substrate, thereby allowing manufacture of a high-quality nitride semiconductor.

BEST MODE

Hereinafter, preferred embodiments of the present disclosure will be described in detail with reference to the accompanying drawings. However, the embodiments of the present disclosure may be modified in various ways, and the scope of the present disclosure should not be limited to the following embodiments. The embodiments of the present disclosure are provided for perfect explanation of the present disclosure to those skilled in the art. Thus, shapes or the like of elements in the drawings are exaggerated for clearer explanation, and on the drawing, like symbols designate like elements.

Figure 2:
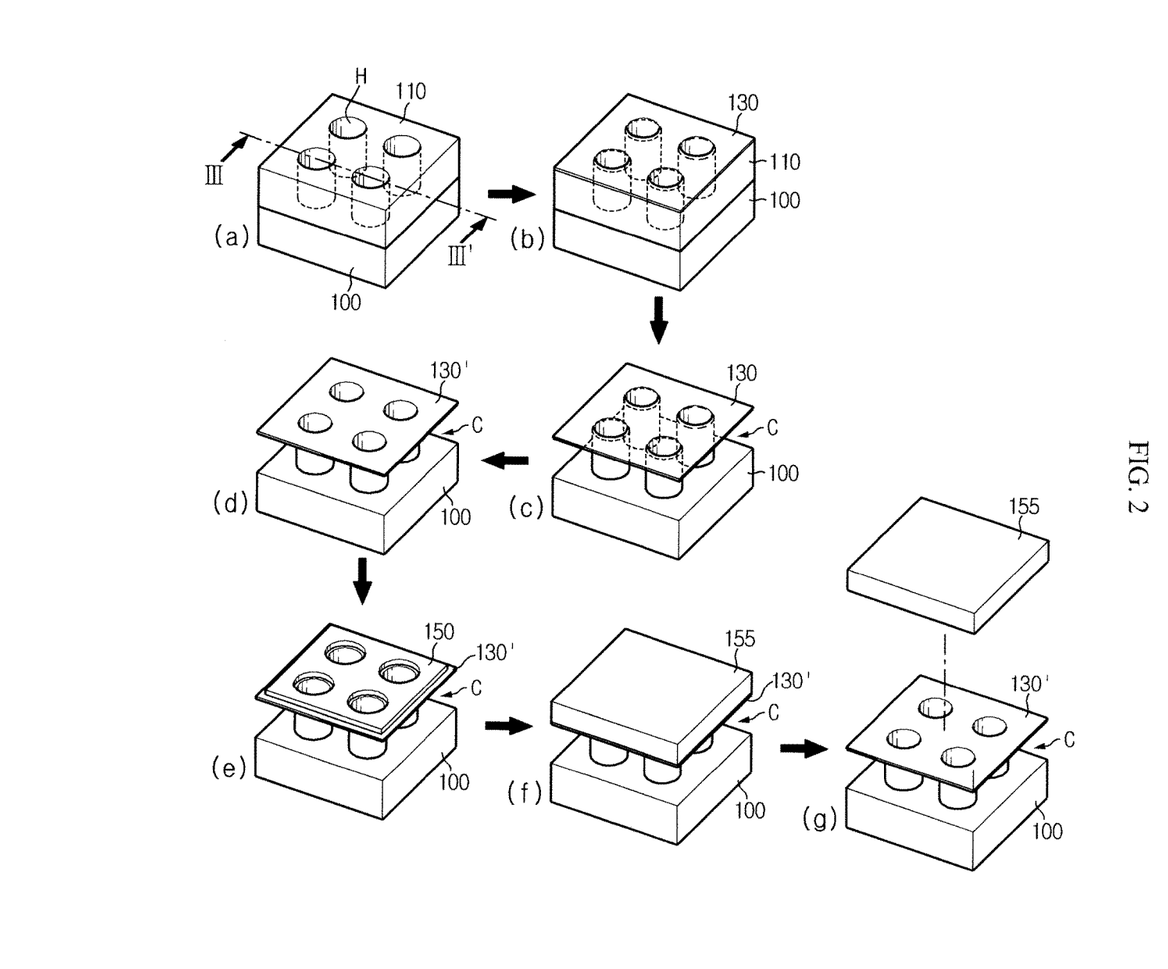
FIG. 2 is a perspective view showing each process for illustrating a substrate structure, a semiconductor lamination structure, a method for forming the same, and a method for manufacturing a nitride semiconductor according to the present disclosure.
Figure 3:
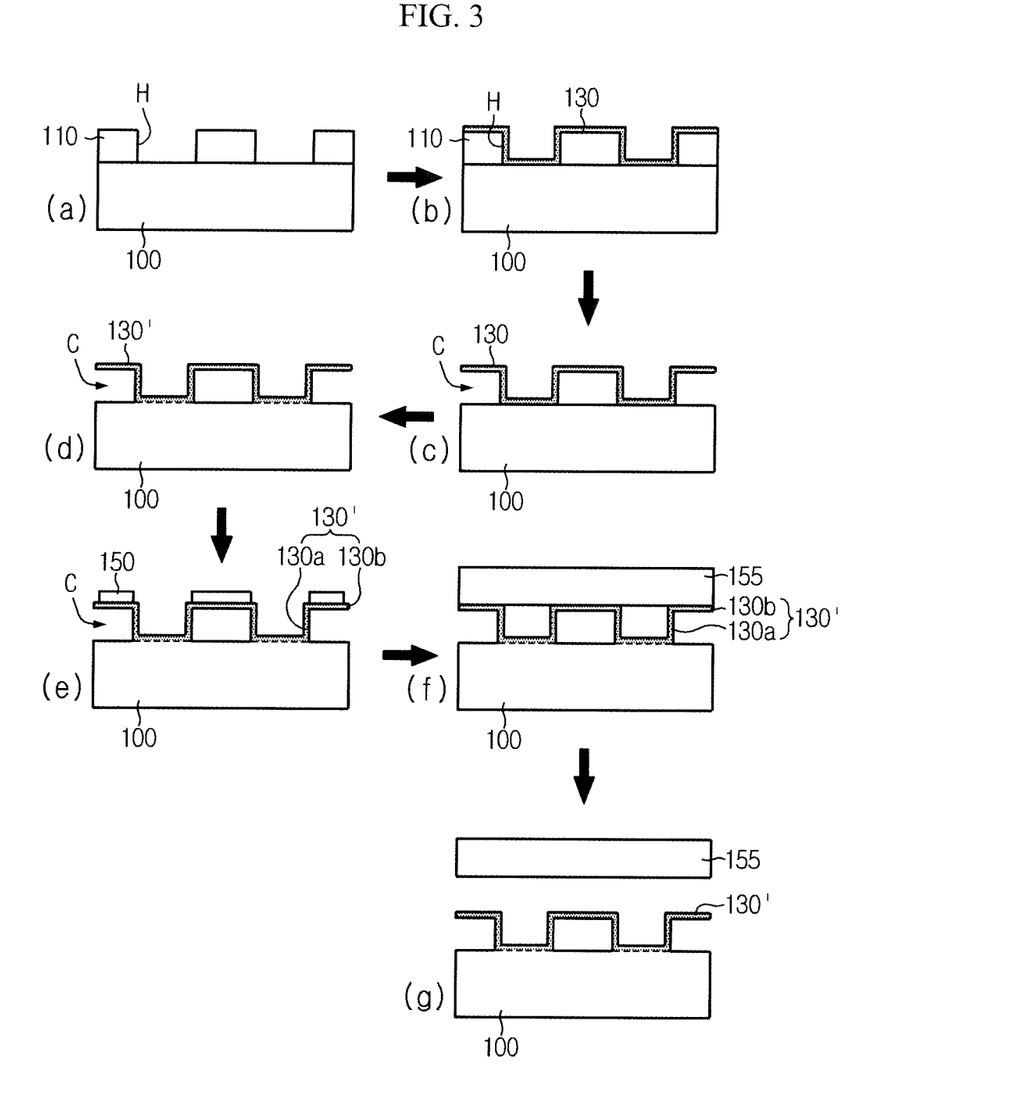
FIG. 3 is a cross-sectional view showing each process, taken along the line of FIG. 2.

FIG. 2 is a perspective view showing each process for illustrating a substrate structure, a semiconductor lamination structure, a method for forming the same, and a method for manufacturing a nitride semiconductor according to the present disclosure, and FIG. 3 is a cross-sectional view showing each process, taken along the line III-III' of FIG. 2.

First, as shown in FIG. 2(a) and FIG. 3(a), a hole-type sacrificial layer pattern 110 is formed on a single-crystal substrate 100 which is heterogeneous from a nitride semiconductor. The sacrificial layer pattern 110 is formed to have a hole H. The hole H is an opening which exposes a bottom of the substrate 100.

Figure 4:
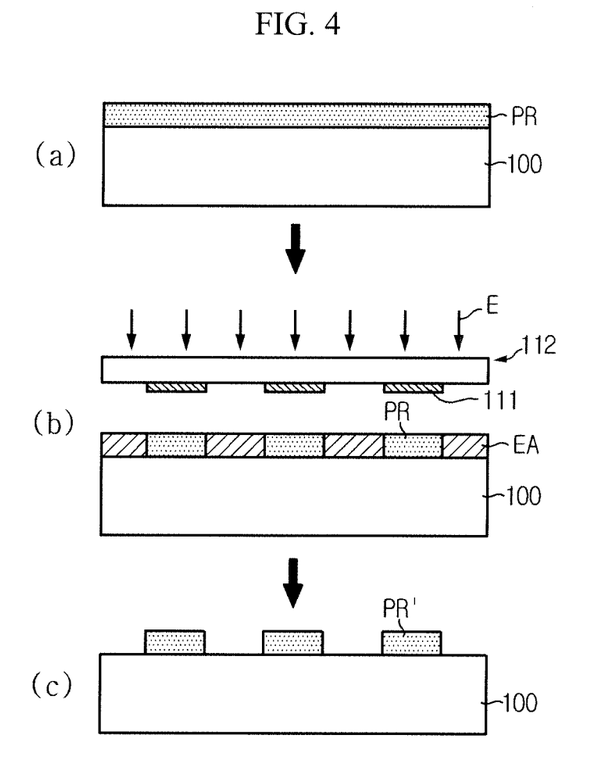
FIGS. 4 and 5 are diagrams for illustrating various methods for forming a hole-type sacrificial layer pattern according to the present disclosure.
Figure 5:
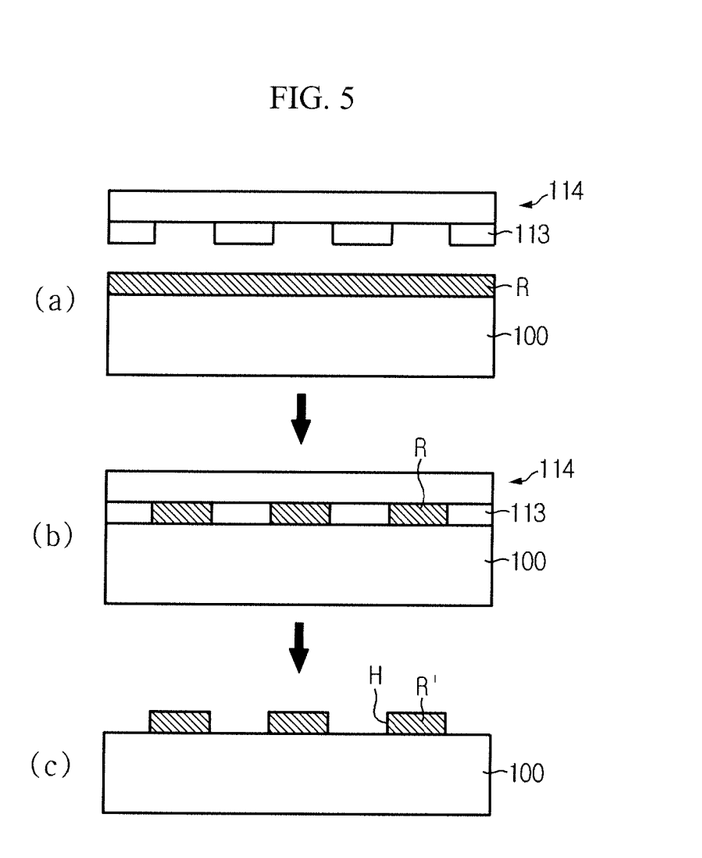

The sacrificial layer pattern 110 may be formed in various ways. FIGS. 4 and 5 are diagrams for illustrating various methods for forming a hole-type sacrificial layer pattern according to the present disclosure.

First, the sacrificial layer pattern 110 may be formed by means of a photolithography method. For example, as shown in FIG. 4(a), a photoresist PR is coated on the substrate 100. The photoresist PR may be coated on the substrate 100 by means of any method selected from the group consisting of spin coating, dip coating, spray coating, dropping, and dispensing, among which spin coating is preferred for the uniformity of the coating film.

After that, as shown in FIG. 4(b), the photoresist PR is exposed (E) using a photo mask 112 having a suitable light-shielding pattern 111. Light passing through a region other than the light-shielding pattern 111 exposes a part of the photoresist PR, thereby generating an exposed area EA. After that, if the exposed area EA is developed and removed, a photoresist pattern PR' having the hole H may remain, as shown in FIG. 4(c). Here, even though the photoresist PR is a positive type in which the exposed area is removed as an example, a negative-type photoresist where the exposed area is not removed may also be used. In this case, it would be understood by those skilled in the art that a location of the light-shielding pattern of the photo mask should be changed.

The light-shielding pattern 111 may be formed by controlling to have a regular opening shape, size, interval or the like according to a design technique of the semiconductor manufacturing process, and thus the photoresist pattern PR' may also be controlled to have holes with an adjusted shape, size and two-dimensional arrangement. This photoresist pattern PR' may be used as the hole-type sacrificial layer pattern 110. If necessary, an additional process such as a reflow process may be further performed to modify the shape of the photoresist pattern PR'.

In another case, the hole-type sacrificial layer pattern 110 may be formed by means of a nano-imprint method. Referring to FIG. 5(a), a nano-imprint resin R is coated on the substrate 100. The nano-imprint resin R may also be coated on the substrate 100 by means of any method selected from the group consisting of spin coating, dip coating, spray coating, dropping, and dispensing, among which spin coating is preferred for the uniformity of the coating film. A nano-imprint stamp 114 having a pattern 113 with a suitable uneven structure is prepared. The nano-imprint stamp 114 may be a master mold made of silicon or quartz in a common method, or an organic mold prepared by duplicating the master mold.

After that, the nano-imprint stamp 114 is compressed onto the nano-imprint resin R as in FIG. 5(b). By doing so, the nano-imprint resin R is filled between the patterns 113 of the nano-imprint stamp 114. The nano-imprint resin R is cured by heating together with compressing, irradiating ultraviolet rays, or irradiating ultraviolet rays together with heating. After that, if the nano-imprint stamp 114 is separated, as shown in FIG. 5(c), the cured nano-imprint resin R' remains on the substrate 100, which may be used as the hole-type sacrificial layer pattern 110.

In order to form a hole, the pattern 113 with an uneven structure may be formed to have a pillar shape by controlling to have a regular shape, size, interval or the like according to the design of the nano-imprint method, and thus it is also possible to adjust a hole shape, size and two-dimensional arrangement of the cured nano-imprint resin R' formed therefrom. If required, the shape of the cured nano-imprint resin R' may also be modified by additionally heating or irradiating ultraviolet rays.

In addition, the pattern with an uneven structure may also be prepared by means of laser interface lithography or the like. The laser interface lithography uses a two-dimensional or three-dimensional interference phenomenon obtained by two or more laser sources and is a method for forming a periodic pattern, which may easily implement a fine pattern of 1 μm or below, advantageously.

According to the present disclosure as above, the hole-type sacrificial layer pattern 110 may be formed relatively simply, with relatively less damage of the substrate and simplified processes in comparison to an existing PSS technique where the substrate is etched.

The substrate 100 on which such various hole-type sacrificial layer patterns 110 are formed may employ all kinds of heterogeneous single-crystal substrates, used for heterogeneous epitaxial thin film growth of a nitride semiconductor layer such as a sapphire substrate, a silicon substrate, a SiC substrate, a GaAs substrate or the like. The embodiment will be explained based on the sapphire substrate as an example.

After the sacrificial layer pattern 110 is formed as shown in FIG. 2(a) and FIG. 3(a), an inorganic thin film 130 is formed on the sacrificial layer pattern 110 as shown in FIG. 2(b) and FIG. 3(b). The inorganic thin film 130 defines an integrated cavity between the inorganic thin film 130 and the substrate 100 later, and the inorganic thin film 130 may be formed within a temperature range at which the sacrificial layer pattern 110 is not deformed. The inorganic thin film 130 has a thickness which may stably maintain the original shape of the structure after the sacrificial layer pattern 110 is removed. The inorganic thin film 130 may be formed in various ways such as atomic layer deposition (ALD), wet synthesis, metal deposition and oxidation, sputtering or the like. Also, while a metal thin film is being deposited, nitrogen may be supplied in a gas or plasma state to form metal nitride. The inorganic thin film 130 may be made of at least one oxide or nitride selected from the group consisting of silica ($SiO_2$), alumina ($Al_2O_3$), titania ($TiO_2$), zirconia ($ZrO_2$), yttria ($Y_2O_3$)-zirconia, copper oxide (CuO, $Cu_2O$), tantalum oxide ($Ta_2O_5$), aluminum nitride (AlN), and silicon nitride ($Si_3N_4$). In an embodiment using a sapphire substrate, the inorganic thin film may be made of alumina. In an embodiment using a silicon substrate, the inorganic thin film may be made of MN. If at least one of composition, strength and thickness of the inorganic thin film 130 is adjusted, a stress applied to a nitride semiconductor layer formed on the substrate structure using the inorganic thin film 130 may be controlled later. As shown in the figures, the inorganic thin film 130 is formed over the entire substrate 100 to cover the sacrificial layer pattern 110.

In an embodiment, if the inorganic thin film 130 is formed by means of ALD, a very thin film may be deposited with a very uniform thickness. Thus, as well shown in the cross-sectional view of FIG. 3(b), the inorganic thin film 130 coats an inner wall and a bottom of the hole H without filling the hole H and covers an upper surface of the sacrificial layer pattern 110. In this case, a leg portion representing a portion of the inorganic thin film substantially perpendicular to the substrate 100 to serve as a support structure connecting the substrate 100 and a nitride semiconductor layer formed in a following process means a portion of the inorganic thin film piled up on the inner wall and the bottom of the hole H and has a pipe shape. Even though any method other than ALD is used, or even though ALD is used, if the hole H has a very small diameter, the hole H may be entirely filled with the inorganic thin film 130. In this case, the leg portion has a pillar shape.

Generally, the hole H may have a diameter of 2 μm or below, so that an upper portion of the hole H may be easily filled when the nitride semiconductor layer is formed by means of ELO. A pitch between the holes H may be 2 μm or above. In order to minimize a density of the leg portion like a pipe or a pillar, it is desirable to maximize the pitch.

In an embodiment, alumina may be formed with a uniform thickness by means of a deposition method such as ALD according to the shape of the substrate 100 and the sacrificial layer pattern 110. A wet composition method using a wet chemical may also be used instead of the deposition method. After a wet chemical is uniformly coated according to the shape of the substrate 100 and the hole-type sacrificial layer pattern 110, this may be heated, dried or chemically reacted to compose alumina. For example, after aluminum precursor powder such as aluminum chloride ($AlCl_3$) is mixed in a solvent such as tetrachloroethylene ($C_2Cl_4$), this may be applied and coated to the substrate 100 on which the hole-type sacrificial layer pattern 110 is formed, and then heated and reacted under an oxygen environment to form an alumina thin film. In other case, after a metal Al thin film is deposited by means of sputtering or the like, an oxidation process may be performed to form alumina. The alumina is formed in an amorphous state or in a polycrystalline state of fine grains.

After the inorganic thin film 130 is formed, the sacrificial layer pattern 110 is selectively removed from the substrate 100 as shown in FIG. 2(c) and FIG. 3(c). As described above with reference to FIG. 4 and FIG. 5, the sacrificial layer pattern 110 is made of a polymer such as a photoresist or a nano-imprint resin, and thus the sacrificial layer pattern 110 may be easily removed by heating. The photoresist having a natural ignition point of about 600° C. may be easily removed by heating. In addition, for easier removal in an oxidation way, a chemical reaction with gas containing oxygen may be added. If a polymer is heated at high temperature under an oxygen environment, the polymer component may be easily removed by means of a pyrolysis process, which is generally called ashing. If thermal treatment under an oxygen environment is not available, for example, if the substrate 100 is a silicon substrate which may produce oxides, a wet removal method using an organic solvent may also be used.

If the sacrificial layer pattern 110 is removed, as shown in FIG. 2(c) and FIG. 3(c), an integrated cavity C defined by the substrate 100 and the inorganic thin film 130 may be formed. The cavity C defined by the inorganic thin film 130 has an inversed shape of the sacrificial layer pattern 110. In other words, if the sacrificial layer pattern 110 is formed to have a plurality of holes H spaced apart from each other, the inorganic thin film 130 is connected to the substrate 100 through the plurality of holes H. The cavity C represents a portion except for connection portions between the inorganic thin film 130 and the substrate 100. Also, if the holes H are discontinuous spaces spaced apart from each other, the cavity C is an integrated continuous space communicated integrally. The cavity C has a greater volume when it is an integrated continuous space, in comparison to a case where it is forming with a plurality of discontinuous spaces spaced apart from each other. In other words, by forming the continuous cavity C, the substrate 100 and a structure formed thereon may have a minimal contact area.

The inorganic thin film 130 in an as-deposited state is generally amorphous or has poly crystals of fine grains. Thermal treatment may be performed at high temperature so that the amorphous or polycrystalline inorganic thin film 130 may be densified and crystallized.

Even though the inorganic thin film 130 and the substrate 100 are made of the same material, for example the substrate 100 is a sapphire substrate and the inorganic thin film 130 is made of alumina, or even though the inorganic thin film 130 and the substrate 100 are made of different materials, for example the substrate 100 is a silicon substrate and the inorganic thin film 130 is made of AlN, if the inorganic thin film 130 is heated at about 1000° C. for example, the inorganic thin film 130 becomes an inorganic thin film 130' crystallized into the same crystal structure as the substrate 100 by means of thermal treatment, as shown in FIG. 2(d) and FIG. 3(d). Accordingly, an interface (depicted with a dotted line in the figures) between the crystallized inorganic thin film 130' and the substrate 100 disappears. The reason is because the inorganic thin film 130 directly contacts the substrate 100 during the high-temperature thermal treatment to cause solid phase epitaxy near the inorganic thin film 130 and is thus crystallized along the crystallization direction of the substrate 100. The solid epitaxy starts from an interface between the substrate 100 and the inorganic thin film 130, and if the inorganic thin film 130 is made of amorphous material, the crystallized inorganic thin film 130' finally becomes polycrystalline, or fine poly crystals become larger, or most preferably are transformed into single crystals identical to the substrate 100. This crystallization process may be performed over the entire inorganic thin film 130, and particularly, a portion of the crystallized inorganic thin film 130' above the integrated cavity C, namely an upper surface representing a portion of the inorganic thin film 130' substantially parallel to the substrate 100 to serve as a support structure connecting the substrate 100 and a nitride semiconductor layer formed in a following process, acts as a seed portion when the nitride semiconductor epitaxial layer grows later. Thus, it is desirable that the inorganic thin film 130 is essentially crystallized.

Figure 6:
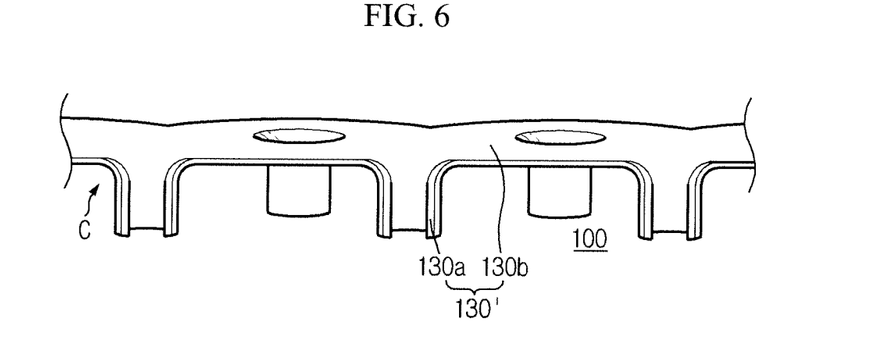
FIG. 6 is a diagram showing a crystallized inorganic thin film according to the present disclosure in a better way.

FIG. 6 is a diagram showing a crystallized inorganic thin film 130' according to the present disclosure in a better way. Referring to FIG. 6 the crystallized inorganic thin film 130' includes a leg portion 130a making contact with the substrate 100, and an upper surface 130b extending from the leg portion 130a and parallel to the substrate 100. The integrated cavity C is defined by the crystallized inorganic thin film 130' between the crystallized inorganic thin film 130' and the substrate 100. A plurality of leg portions 130a is provided, and the upper surface 130b is continuously formed to extend from the plurality of leg portions 130a. In an embodiment, an area occupied by the cavity C is greater than an area occupied by the leg portions 130a. The inorganic thin film 130' is a very important component in the present disclosure since it defines the integrated cavity C between the inorganic thin film 130' and the substrate 100 and also serves as a seed layer and a support of a nitride semiconductor layer growing thereon later.

As described above, the substrate structure according to the present disclosure includes the substrate 100, the leg portion 130a contacting the substrate 100 to define the integrated cavity C with the substrate 100, and the upper surface 130b extending from the leg portion 130a in parallel to the substrate 100, and also includes the crystallized inorganic thin film 130' having the same crystal structure as the substrate 100.

The substrate structure of the present disclosure is defined as a cavity engineering structure (CES), contrasted with an existing PSS. Now, a semiconductor lamination structure using the CES, a method for forming the same, and a method for manufacturing a nitride semiconductor using the same will be described.

Subsequently, as shown in FIG. 2(e) and FIG. 3(e), a nitride semiconductor layer 150 is further formed on the crystallized inorganic thin film 130'. The nitride semiconductor layer 150 may be formed into a multilayered structure including a suitable buffer layer. The nitride semiconductor layer 150 may made of any nitride semiconductor material such as GaN, InN, AlN or their mixtures $Ga_xAl_yIn_zN$ (0<x, y, z<1). Depending on the kind of material of the nitride semiconductor layer 150, a band gap may be adjusted to emit ultraviolet rays, visible rays and infrared rays. At this time, the nitride semiconductor layer 150 does not grow on the substrate 100. Instead, a seed grows on a portion of the crystallized inorganic thin film 130' above the integrated cavity C, particularly on the upper surface 130b, and the portions growing therefrom with various growth conditions are merged to finally form a nitride semiconductor layer 155 of a thin film shape as shown in FIG. 2(f) and FIG. 3(f). As described above, in the present disclosure, the nitride semiconductor layer 155 does not grow from the substrate 100 but grows from the portion of the crystallized inorganic thin film 130' above the integrated cavity C. Thus, the nitride semiconductor layer 155 is formed in an entirely different way from the existing ELO method.

The growth of crystals in the CES according to the present disclosure may be clearly understood with reference to FIGS. 3(e) and 3(f). Namely, the nitride semiconductor layer 150 starts growing on an upper flat surface of the inorganic thin film 130', namely the upper surface 130b, and grows to cover the leg portion 130a, namely a hole-shaped upper portion. The nitride semiconductor layer 150 growing on the upper surface 130b is connected in a lateral direction to form the nitride semiconductor layer 155 with a less crystal defect.

In the present disclosure, the crystallized inorganic thin film 130' may solve a stress together with the nitride semiconductor layer 155 growing thereon and thus play a role of a compliant layer. Also, since the stress causing dislocation is solved, the substrate structure may grow in high quality with a less defect density.

The stress caused by a physical difference between the substrate and the thin film is converted into elastic energy at the interface to serve as a driving force generating dislocation. In general cases, the substrate is not easily deformed due to a great thickness in comparison to the thin film, and dislocation is generated at the thin film to solve the stress. At this time, if the thin film grows over a predetermined thickness, namely a critical thickness, the elastic energy at the interface increases over the dislocation generation energy, and thus dislocation starts being generated.

However, in the present disclosure, if the inorganic thin film 130' is thinner than the nitride semiconductor layer 155, the critical thickness is much greater, thereby lowering the generation of dislocation of the nitride semiconductor layer 155. If the inorganic thin film 130' is sufficiently thinner than the nitride semiconductor layer 155 as described above, it may be regarded that its role is replaced with that of the substrate, and the nitride semiconductor layer 155 grows in a state where dislocation is generated less. Therefore, it is possible to form the high-quality nitride semiconductor layer 155 with a less defect density. Also, since the nitride semiconductor crystal defect density decreases, the internal quantum efficiency may be enhanced when the high-quality nitride semiconductor layer 155 is used for manufacturing an LED.

As shown in FIG. 2(*f*) and FIG. 3(*f*), the semiconductor lamination structure according to the present disclosure configured as above includes the single-crystal substrate 100 heterogeneous from a nitride semiconductor, and the crystallized inorganic thin film 130'. The integrated cavity C is defined between the substrate 100 and the inorganic thin film 130'. The substrate structure also includes the nitride semiconductor layer 155 growing on the crystallized inorganic thin film 130' above the integrated cavity C and is merged thereto.

The integrated cavity C is formed in a region where the hole-type sacrificial layer pattern 110 is removed. Since the integrated cavity C is present, if there is a difference in thermal expansion coefficient between the substrate 100 and the nitride semiconductor layer 155 formed thereon, the integrated cavity C may be elongated or contracted to form a local deformation, thereby consuming the stress energy. Accordingly, the thermal stress applied to the nitride semiconductor layer 155 may be reduced, and thus the bending of the substrate 100 may be reduced. Therefore, the substrate 100 may have a relatively small thickness even though it has a large area.

In particular, the integrated cavity C may be controlled by adjusting a shape, size, two-dimensional arrangement or the like of the hole-type sacrificial layer pattern. Also, since the hole-type sacrificial layer pattern 110 is formed in a controlled method such as photolithography or nano-imprint, the integrated cavity C is not formed irregularly or randomly but is formed in a controlled way, thereby ensuring good reproduction and excellent device uniformity.

As a result, the nitride semiconductor layer 155 with excellent properties may grow in an epitaxial way, and thus an opto-electronic device with high efficiency and excellent reliability may be implemented. In addition, due to the increased optical extraction efficiency, it is possible to implement a high-output LD or LED.

Meanwhile, the integrated cavity C may allow a structure where the connections between the substrate 100 and the nitride semiconductor layer 155 are minimized. Since the substrate 100 and the nitride semiconductor layer 155 are physically separated to some extent, the generation of stress is further suppressed. Thus, while the nitride semiconductor layer 155 grows and is then cooled, the nitride semiconductor layer 155 and the substrate 100 may be naturally separated from each other just with a small physical force or impact without applying large energy such as laser, as shown in FIG. 2(*g*) and FIG. 3(*g*).

In particular, in an embodiment, an area occupied by the cavity C is greater than an area occupied by the leg portions 130*a*. Therefore, even though the laser lift-off method is not used, the nitride semiconductor layer 155 may be easily separated from the substrate 100. Since separation is made naturally or just with a small force, the nitride semiconductor layer 155 may not be bent, cracked or broken. Therefore, the present disclosure is very advantageous to applications where the substrate 100 and the nitride semiconductor layer 155 need to be separated, for example a vertical-type LED, a horizontal-type LED, or a LED transported to any substrate, and also the substrate 100 may be easily reutilized. Moreover, if the nitride semiconductor layer 155 is formed as a thick film and separated from the substrate 100, the nitride semiconductor layer 155 may be utilized as a free-standing nitride semiconductor substrate, and thus it is easy to manufacture a nitride semiconductor substrate as the same kind of substrate for excellent nitride semiconductor growth.

As described above, in the present disclosure, in order to minimize the connection portion between the nitride semiconductor layer 155 and the substrate 100, the substrate 100 and the nitride semiconductor layer 155 are connected just through points, rather than a line. The point-connected portion is the leg portion 130*a* of the inorganic thin film 130' and may have a hollow pipe shape. In order to form the leg portion 130*a* of a pipe shape, in an embodiment of the present disclosure, the hole-type sacrificial layer pattern 120 and the inorganic thin film 130 formed by means of ALD are used. A final structure obtained by removing the sacrificial layer pattern 120 has the integrated cavity C continuously connected.

Due to the integrated cavity C, the physical lift-off process may be performed easily without using laser.

Figure 7:
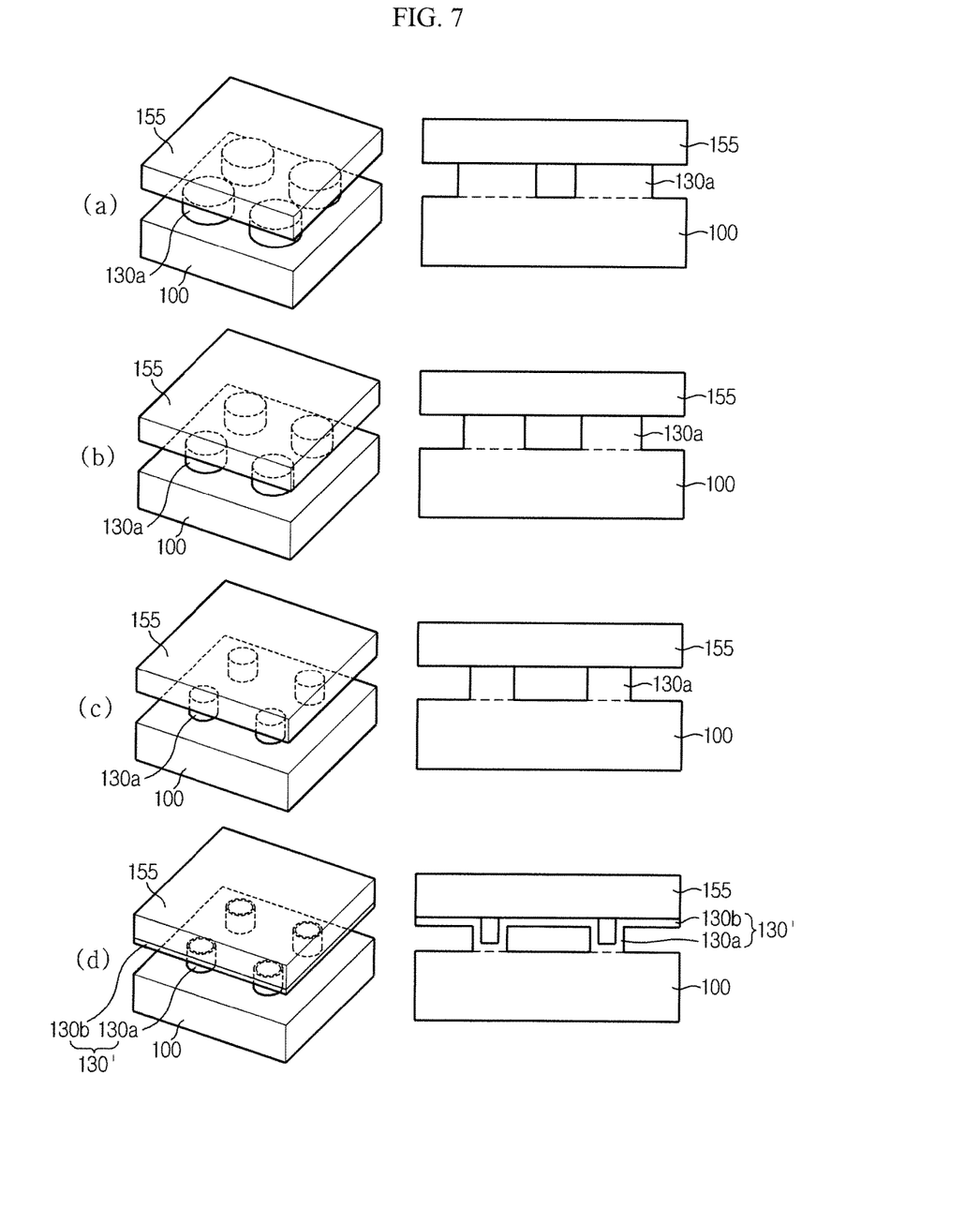
FIG. 7 is a diagram showing that a nitride semiconductor layer and a substrate may be separated with a smaller force according to the present disclosure.

FIG. 7 is a diagram showing that the leg portion 130*a* connecting the nitride semiconductor layer 155 and the substrate 100, namely the pillar, has an area gradually decreasing from FIG. 7(*a*) to FIG. 7(*d*) so that the nitride semiconductor layer 155 and the substrate 100 may be separated with a smaller force. In an embodiment of the present disclosure, the leg portion 130*a* with a pillar structure has a hollow pipe shape as shown in FIG. 7(*d*), thereby minimizing a direct connection between the nitride semiconductor layer 155 and the substrate 100. In the present disclosure, by using the inorganic thin film 130' having the leg portion 130*a* with a hollow pipe shape as described above, the nitride semiconductor layer 155 is supported.

According to the present disclosure, it is possible to guide dislocation to be generated only above the leg portion 130*a*, namely the hole, and even though MN grows, excellent crystal quality is ensured, different from PSS. Moreover, by using the characteristic of the integrated cavity C capable of absorbing stress, bending caused by a difference in thermal expansion coefficient may be prevented.

Hereinabove, while the preferred embodiments of the present disclosure have been illustrated and described, the present disclosure is not limited to the particular preferred embodiment described above, and it is apparent to those skilled in the art that modifications may be made in various forms without departing from the features of the present disclosure set forth in the claims, and such modifications reside in the scope of the claims.

What is claimed is:

1. A substrate structure, comprising:
    a single-crystal substrate heterogeneous from a nitride semiconductor; and
    a crystallized inorganic thin film having a plurality of leg portions configured to contact the substrate and to define an integrated cavity between the leg portions and the substrate and an upper surface extending from the leg portions and parallel to the substrate, the crystallized inorganic thin film having the same crystal structure as the substrate, and each of the leg portions having a hollow pipe shape.

2. The substrate structure according to claim 1,
    wherein an area occupied by the cavity is greater than an area occupied by the leg portions.

3. A semiconductor lamination structure, comprising:
    a single-crystal substrate heterogeneous from a nitride semiconductor;
    a crystallized inorganic thin film having a plurality of leg portions configured to contact the substrate and an upper surface extending from the leg portions and parallel to the substrate so that an integrated cavity is defined between the leg portions, the upper surface, and the substrate, the crystallized inorganic thin film having the same crystal structure as the substrate, and each of the leg portions having a hollow pipe shape; and a nitride semiconductor layer formed on the inorganic thin film.

4. The semiconductor lamination structure according to claim 3, wherein the nitride semiconductor layer grows on the crystallized inorganic thin film above the integrated cavity and is merged thereto.

5. A method for forming a substrate structure, comprising:

forming a hole-type sacrificial layer pattern on a single-crystal substrate which is heterogeneous from a nitride semiconductor;

forming an inorganic thin film on the sacrificial layer pattern;

removing the sacrificial layer pattern from the substrate on which the inorganic thin film is formed, so that an integrated cavity surrounding a plurality of hollow pipe shapes is formed and is defined by the substrate and the inorganic thin film; and crystallizing the inorganic thin film into the same crystal structure as the substrate.

6. The method for forming a substrate structure according to claim 5, wherein the inorganic thin film is formed by means of atomic layer deposition (ALD).

7. The method for forming a substrate structure according to claim 5, wherein the sacrificial layer pattern is removed by means of thermal treatment under an oxygen environment or wet removal using an organic solvent.

8. The method for forming a substrate structure according to claim 5, wherein the sacrificial layer pattern is removed by means of thermal treatment under an oxygen environment, and the inorganic thin film is crystallized by means of thermal treatment at a higher temperature.

9. A method for forming a semiconductor lamination structure, comprising:

performing the method according to claim 5; and growing a nitride semiconductor layer on the crystallized inorganic thin film above the cavity.

10. A method for manufacturing a nitride semiconductor, comprising:

performing the method according to claim 9; and separating the substrate and the nitride semiconductor layer from each other.

* * * * *

UNITED STATES PATENT AND TRADEMARK OFFICE
CERTIFICATE OF CORRECTION

| | | |
|---|---|---|
| PATENT NO. | : 10,355,169 B2 | Page 1 of 1 |
| APPLICATION NO. | : 15/326256 | |
| DATED | : July 16, 2019 | |
| INVENTOR(S) | : Bae et al. | |

It is certified that error appears in the above-identified patent and that said Letters Patent is hereby corrected as shown below:

In the Specification

In Column 2, Line 59, delete "MN" and substitute therefor --AlN--.

In Column 4, Line 65, delete "MN" and substitute therefor --AlN--.

In Column 5, Line 41, delete "the line of FIG. 2." and substitute therefor --the line III-III' of FIG. 2.--.

In Column 7, Line 53, delete "MN" and substitute therefor --AlN--.

In Column 12, Line 35, delete "MN" and substitute therefor --AlN--.

Signed and Sealed this
Twenty-seventh Day of August, 2019

Andrei Iancu
*Director of the United States Patent and Trademark Office*